(12) United States Patent
Azuma

(10) Patent No.: US 6,498,072 B2
(45) Date of Patent: Dec. 24, 2002

(54) PROCESS FOR PRODUCING SEMICONDUCTOR DEVICE

(75) Inventor: Kenichi Azuma, Kadoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/900,453

(22) Filed: Jul. 9, 2001

(65) Prior Publication Data

US 2002/0006709 A1 Jan. 17, 2002

(30) Foreign Application Priority Data

Jul. 10, 2000 (JP) ........................................ 2000-208417

(51) Int. Cl.[7] .............................................. H01L 21/76
(52) U.S. Cl. ...................... 438/427; 438/424; 438/692; 438/697; 438/700
(58) Field of Search ................................ 438/424, 427, 438/692, 697, 700

(56) References Cited

U.S. PATENT DOCUMENTS

| | | | |
|---|---|---|---|
| 5,911,110 A | * | 6/1999 | Yu .............................. 438/424 |
| 6,069,056 A | * | 5/2000 | Son et al. .................... 438/424 |
| 6,245,642 B1 | * | 6/2001 | Satoh ........................... 438/427 |
| 6,169,012 B1 | * | 1/2002 | Chen et al. .................. 438/427 |

FOREIGN PATENT DOCUMENTS

JP 11-214499 8/1999

* cited by examiner

Primary Examiner—Long Pham
(74) Attorney, Agent, or Firm—Nixon & Vanderhye P.C.

(57) ABSTRACT

A process for producing a semiconductor device including plural element forming regions having different element region widths W and element isolating regions between said element forming regions. The process includes forming trenches on a semiconductor substrate having previously accumulated thereon a first dielectric film for forming isolating regions;

accumulating a second dielectric film having a thickness t on the semiconductor substrate to fill in trenches;

removing part of the second dielectric film on element forming regions that have an element regions width W satisfying the following equation:

$$W \geq 2t/\tan \theta,$$

wherein θ represents a accumulation angle of said second dielectric film on said element forming region; and polishing the second dielectric film.

12 Claims, 10 Drawing Sheets

PROCESS FOR PRODUCING SEMICONDUCTOR DEVICE

CROSS-REFERENCE TO RELATED APPLICATION

This application is related to Japanese Patent Application No. 2000-208417 filed on Jul. 10, 2000, whose priority is claimed under 35 USC §119, the disclosure of which is incorporated by reference in its entirety.

BACKGROUND OF THE INVENTION

1. Field of the Invention

The present invention relates to a process for producing a semiconductor device, and more particularly, it relates to a process for producing a semiconductor device in that a uniform polishing rate can be obtained irrespective to an element region width to enable planation of an element.

2. Description of Related Art

Along with progress of fine structures of elements, an element isolating region electrically isolating elements is also demanded to miniaturize. As a method for forming a minute element isolating region, a trench isolating method has been known, in which trenches are formed on a silicon substrate, and an dielectric film (such as an oxide film) is filled in the trenches.

Examples of a process for filling the trenches with the dielectric film include an LP-CVD process, an $O_3$-TEOS CVD process and an HDP-CVD (high density plasma CVD) process.

Figure 3:
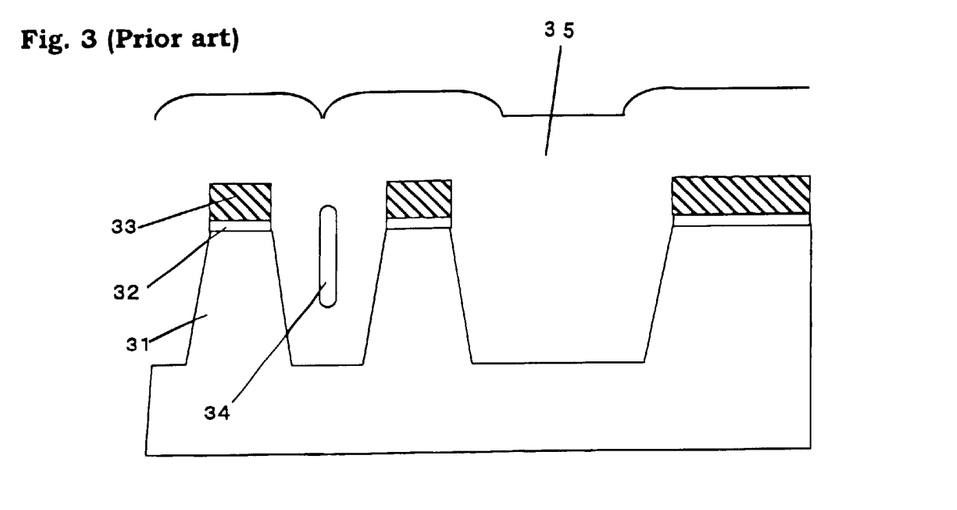
FIG. 3 is a schematic cross sectional view of a semiconductor device produced by method of the prior art.

FIG. 3 is a cross sectional view of a silicon substrate having an oxide film filled therein by the LP-CVD process or the $O_3$-TEOS CVD process. In the figure, numeral 31 denotes a silicon substrate, 32 denotes an oxide film, and 33 denotes an SiN film. In these processes, the isolation dimension of the trenches is decreased along with the progress of fine structures of element of the semiconductor device, and thus the filling capability of the oxide film 35 is in short in the minute trenches, so as to cause a seam 34 (gap). Owing to the presence of the seam 34, dents are formed on the element isolating regions upon forming the semiconductor device, and a material of a gate electrode is accumulated in the dents to cause such a problem that a short circuit is formed among the gate electrodes.

In order to solve the problem, the HDP-CVD process has been widely employed. In the HDP-CVD process, an oxide film is formed, and simultaneously edges of the film thus formed are etched, so as to provide such characteristics that minute trenches can be filled.

Figure 4:
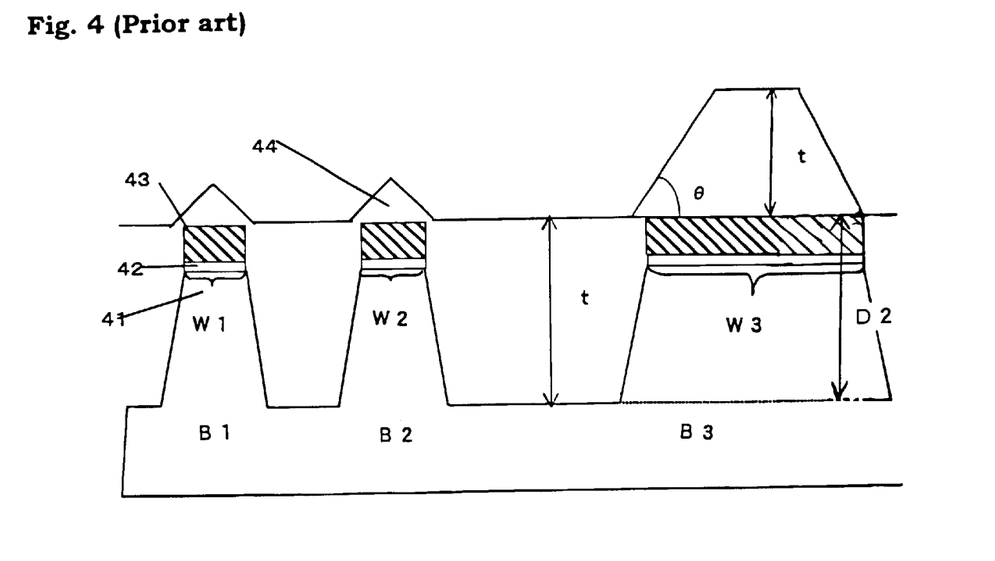
FIG. 4 is a schematic cross sectional view of a semiconductor device produced by method of the prior art.
Figure 5A:
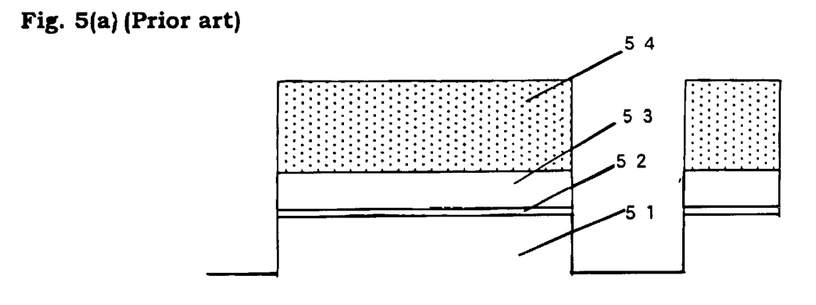
Figure 5B:
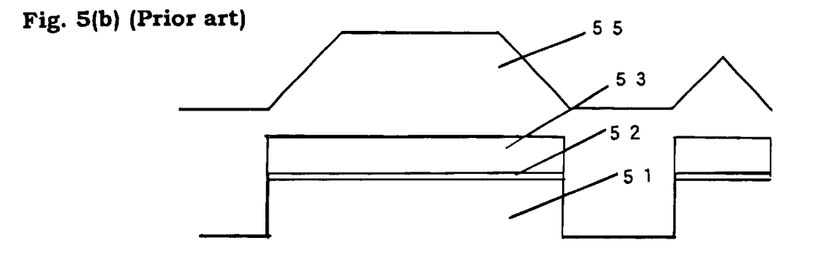
Figure 5C:
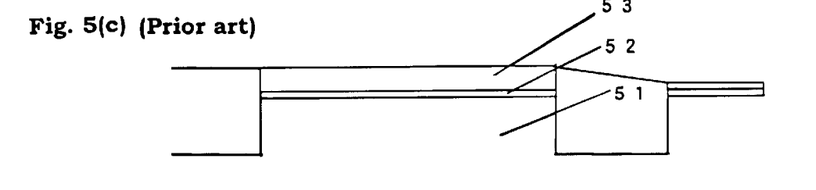
Figure 5D:
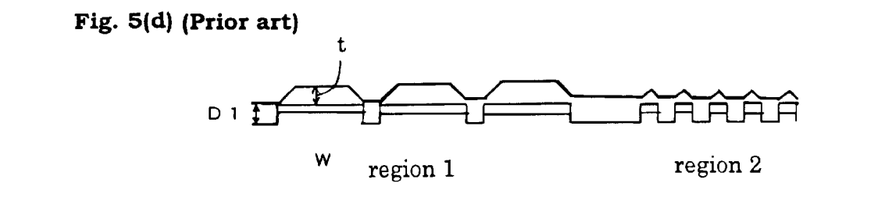
Figure 5E:
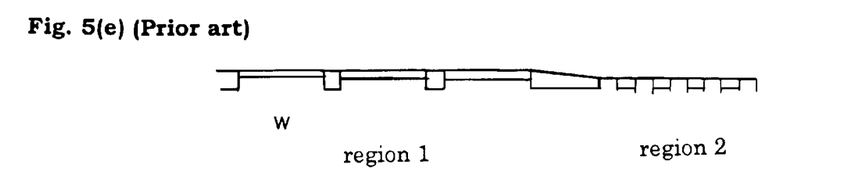
Figure 6A:
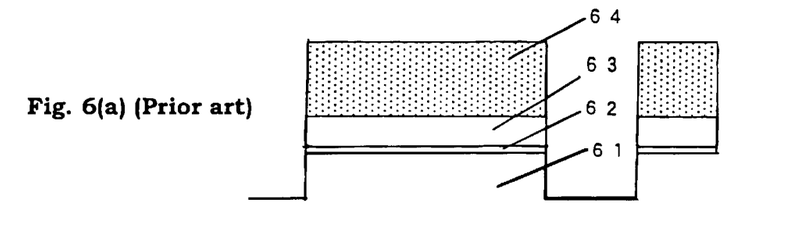
Figure 6B:
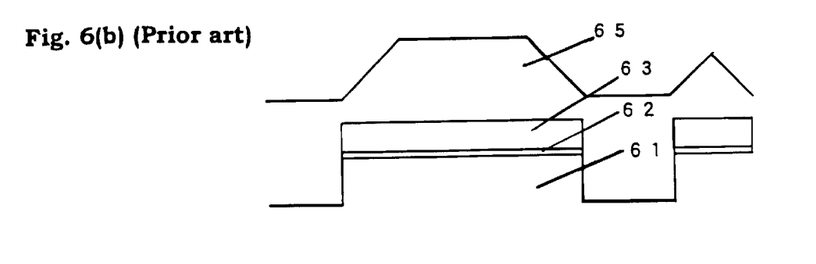
Figure 6C:
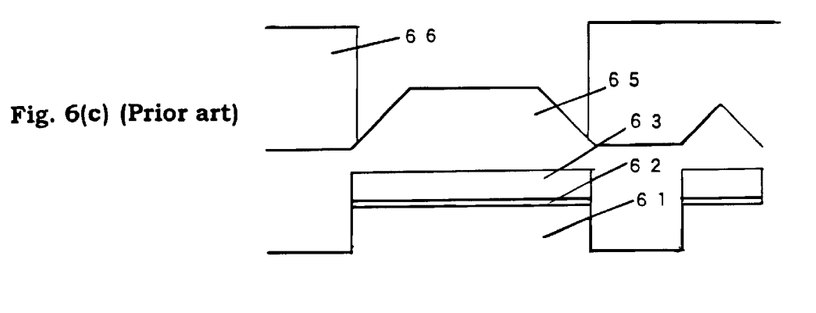
Figure 6D:
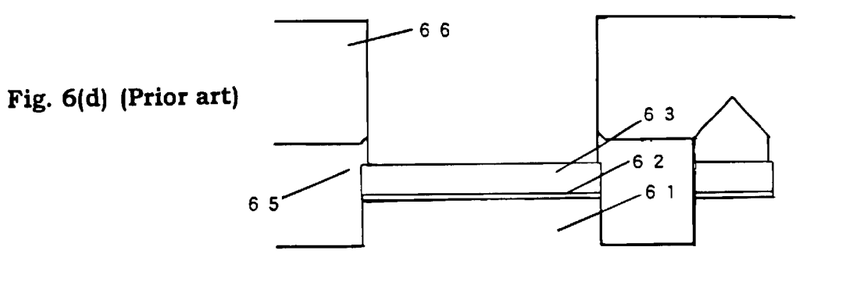
Figure 6E:
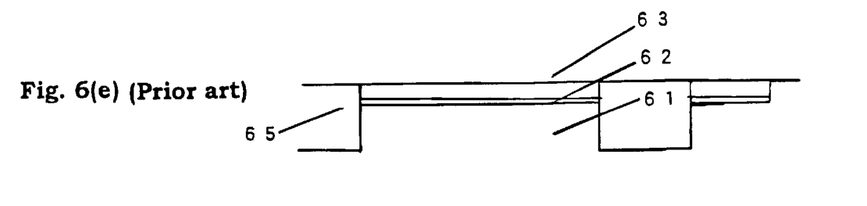

FIG. 4 shows a cross sectional view of a silicon substrate after filling with an oxide film by the HDP-CVD process. In the figure, symbols W1, W2 and W3 denote widths of element regions, B1, B2 and B3 denote element forming regions, t denotes an accumulated thickness of an oxide film thus filled, numeral 41 denotes a silicon substrate, 42 denotes an oxide film, 43 denotes an SiN film, and 44 denotes an oxide film accumulated by the HDP-CVD process (hereinafter, referred to as an HDP-CVD oxide film). As shown in FIG. 4, the HDP-CVD oxide film 44 has an accumulation angle $\theta$ on the element forming regions.

The element region widths W1 and W2 of the element forming regions B1 and B2 in FIG. 4 satisfy the equation:

$$W1\ (W2) < 2t/\tan\theta$$

and the element region width W3 of the element forming region B3 satisfies the equation:

$$W3 > 2t/\tan\theta$$

The dielectric film accumulated on the element forming regions will be described in detail below with reference to FIGS. 13 to 17.

In the following description, t denotes the accumulated thickness of the dielectric film, T denotes the depth of the trench, h denotes the accumulation height of the dielectric film on the element forming region, W denotes the element region width, and $\theta$ denotes the accumulation angle of the dielectric film on the element forming region.

Figure 13:
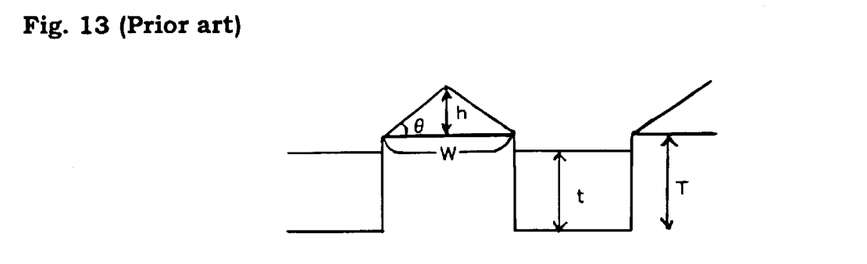
FIG. 13 is a drawing showing the relation of shape of the dielectric film on the element forming region and accumulation thickness of the dielectric film.
Figure 14:
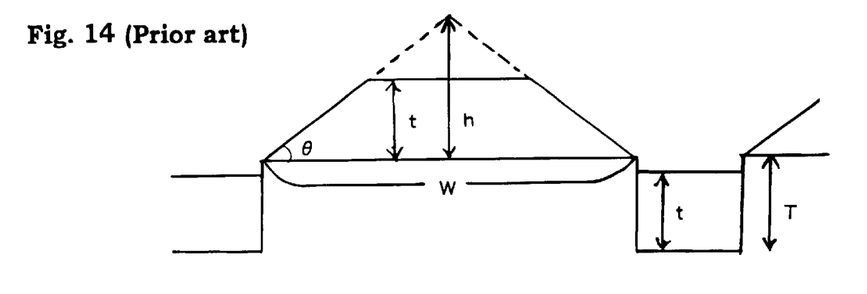
FIGS. 14–17 are drawings explanation the relation of shape of the dielectric film on the element forming region and accumulation thickness of the dielectric film in according to the present invention.

In the case of t<T, a cross sectional view of an element forming region having an element region width W satisfying the equation:

$$W \leq 2t/\tan\theta$$

is shown in FIG. 13, and a cross sectional view of an element forming region having an element region width W satisfying the equation:

$$W > 2t/\tan\theta$$

is shown in FIG. 14.

As shown in FIG. 13, in the case of t≧h, the dielectric film on the element forming region is in the form of an isosceles triangle having a base W and a height h=(W tan $\theta$)/2.

As shown in FIG. 14, in the case of t<h, the dielectric film on the element forming region is in the form of a trapezoid having a lower base W, an upper base W−(2t/tan $\theta$) and a height t.

Figure 15:
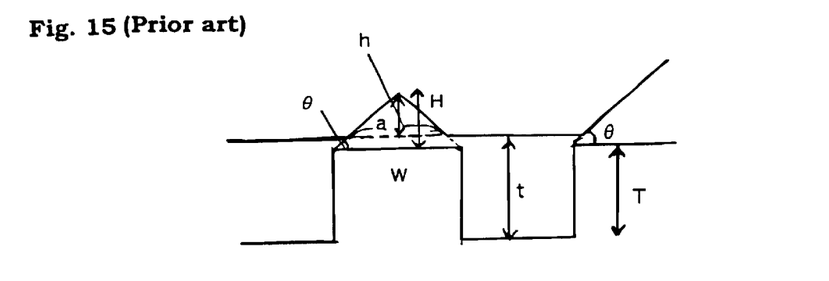
Figure 16:
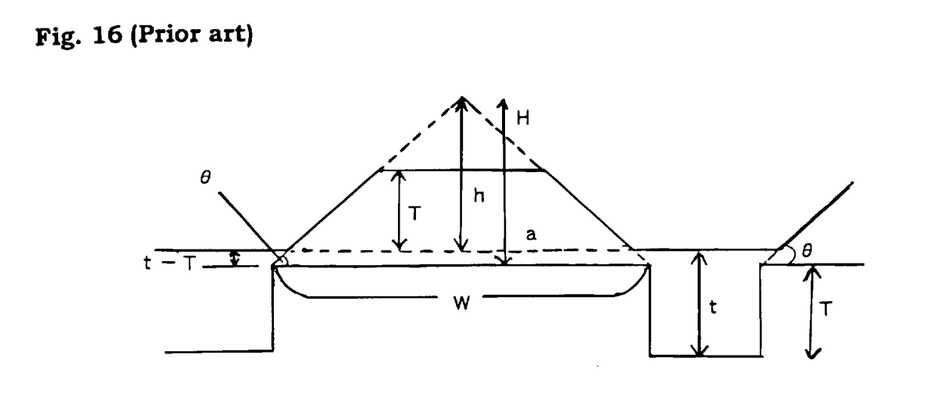

In the case of t>T, a cross sectional view of an element forming region having an element region width W satisfying the equation:

$$W \leq 2t/\tan\theta$$

is shown in FIG. 15, and a cross sectional view of an element forming region having an element region width W satisfying the equation:

$$W > 2t/\tan\theta$$

is shown in FIG. 16.

As shown in FIG. 15, in the case of T≧h, the dielectric film on the element forming region is in the form of an isosceles triangle having a base W−2(t−T)/tan $\theta$ and a height ((W tan $\theta$)/2)−(t−T).

As shown in FIG. 16, in the case of T<h, the dielectric film on the element forming region is in the form of a trapezoid having a lower base W−2(t−T)/tan $\theta$, an upper base W−2t/tan $\theta$ and a height T.

Figure 17:
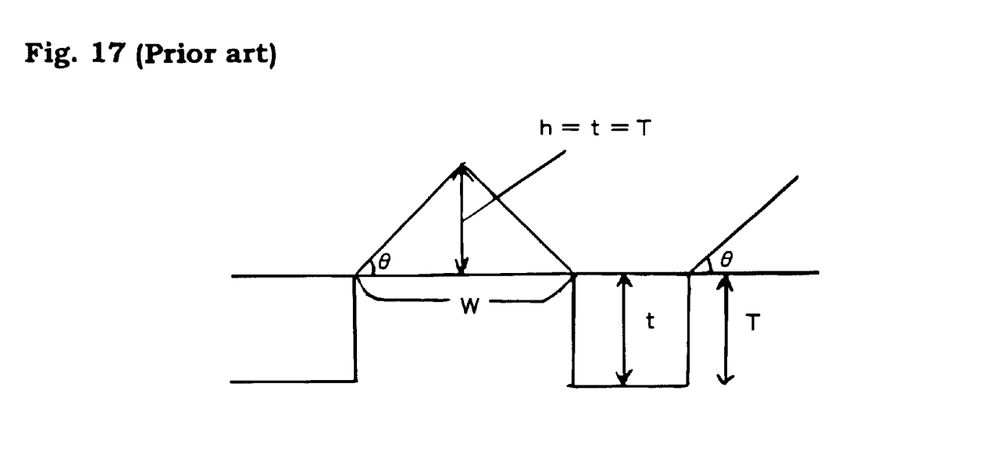

A cross sectional view of an element forming region having an element region width W satisfying the equation:

$$W = 2t/\tan\theta$$

is shown in FIG. 17. In the case of t=T=h, the dielectric film on the element forming region is in the form of an isosceles triangle having a base W and a height of t=T=h.

FIGS. 5(a) to 5(e) show a forming process of an oxide film by the HDP-CVD process.

An oxide film 52 and an SiN film 53 are formed on a silicon substrate 51. After coating a resist 54, on which element isolation regions are then opened by a know photolithography technique, the SiN film 53 and the oxide film 52 are removed by anisotropic dry etching, and trenches are formed on the silicon substrate 51 (FIG. 5(a)). After removing the resist 54 and subjecting the interior of the trenches to thermal oxidation, an HDP-CVD oxide film 55 is accumulated on the whole surface of the substrate (FIG. 5(b)) and is polished by the CMP (chemical mechanical polishing) process until the SiN film 53 is exposed to effect planation, whereby the element isolation regions are formed (FIG. 5(c)).

The planation by the CMP process is greatly affected by the element region width and the density of the element forming regions. Particularly, in the case shown in FIG. 5(d) where there are both the region 1, in which the element forming regions having the relationship between the element region width W and the accumulation thickness t of the oxide film 55 satisfying the equation $W>2t/\tan\theta$ are built up, and the region 2, in which the element forming regions having the relationship between the element region width W and the accumulation thickness t of the oxide film 55 satisfying the equation $W\leq 2t/\tan\theta$ are built up, the polishing rate of the region 1 is smaller than that of the region 2. Therefore, the period of time required for removing by polishing the oxide film 55 in the region 1 is prolonged in comparison to the polishing period required by the region 2, and thus such a problem is developed that the oxide film in the region 2 is excessively polished when the oxide film in the region 1 is completely polished, so as to fail to obtain uniform heights after polishing (FIG. 5(e)).

In order to solve the problem, JP-A-11-214499 proposes the following process to avoid the non-uniformity in polishing process. Trenches are formed on a semiconductor substrate to form element forming regions and element isolating regions, and after accumulating an HDP-CVD oxide film, a mask pattern having openings on part of the element forming regions. The oxide film on the element forming regions is once removed according to the mask pattern, planation is then carried out.

FIGS. 6(a) to 6(e) show a forming process of element forming region according to JP-A-11-214499.

Figure 7A:
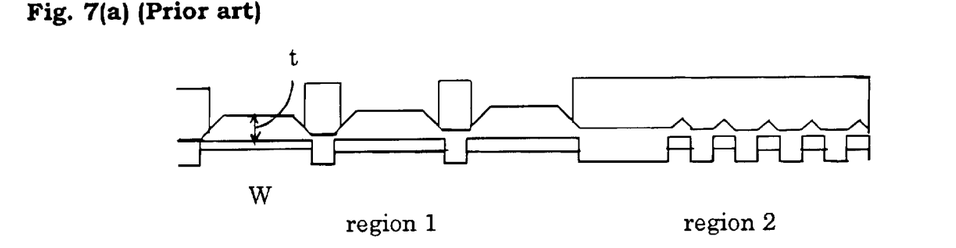
Figure 7B:
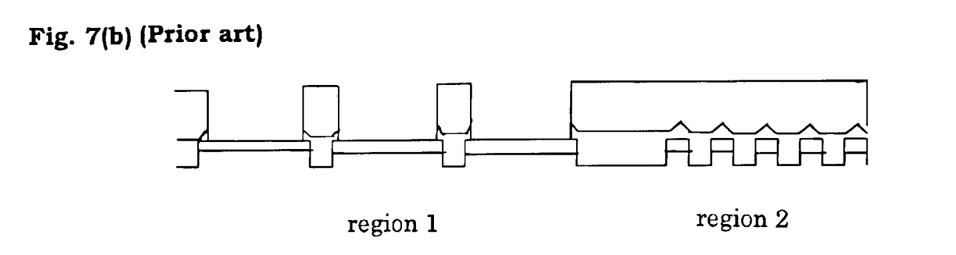
Figure 7C:
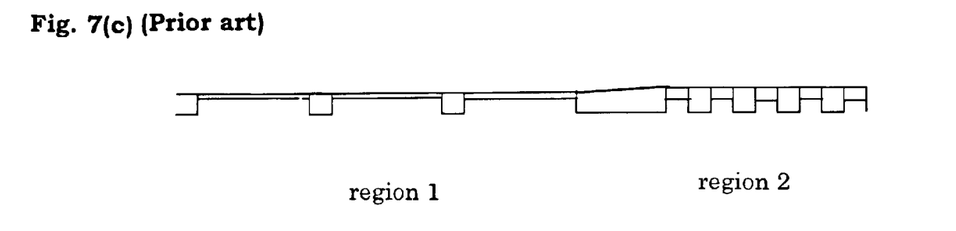

An oxide film 62 and an SiN film 63 are formed on a silicon substrate 61. After coating a resist 64 to form a first mask pattern, the SiN film 63 and the oxide film 62 are removed according to the first mask pattern by a known photolithography technique with anisotropic dry etching, and trenches are formed on the silicon substrate 61 (FIG. 6(a)). After removing the resist 64 and subjecting the interior of the trenches to thermal oxidation, an HDP-CVD oxide film 65 is accumulated on the whole surface of the substrate (FIG. 6(b)). A second mask pattern is formed to have openings on element forming regions that have a large element region width (FIG. 6(c)), and the HDP-CVD oxide film 65 is removed on the element forming regions according to the second mask pattern by dry etching (FIG. 6(d)). After removing the second mask pattern, the oxide film is polished by the CMP process until the SiN film 63 is exposed to effect planation of the wafer (FIG. 6(e)). The publication also discloses that the opening width of the second mask pattern is of a size of at least ½ of the minimum element region width. According to the process, while the planation degree of the wafer is improved, the filled oxide film is also thinned by erosion upon CMP process in the region where the stopper film on polishing (SiN film 63) occupies an area of more than a certain extent. Specifically, in the case where there are both the region 1, in which the element forming regions having the relationship between the element region width W and the accumulation thickness t of the oxide film satisfying the equation $W>2t/\tan\theta$ are built up, and the region 2, in which the element forming regions having the relationship between the element region width W and the accumulation thickness t of the oxide film satisfying the equation $W\leq 2t/\tan\theta$ are built up (FIG. 7(a)), removal of the oxide film according to the second mask pattern brings about the state shown in FIG. 7(b), and when the whole wafer is polished until the SiN film in the region 2 is exposed, the filled oxide film in the element isolating regions in the region 1 is also polished. As a result, a difference of the thickness of the filled oxide film is developed between the element isolating regions in the region 1 and the element isolating regions in the region 2 (FIG. 7(c)).

Figure 8:
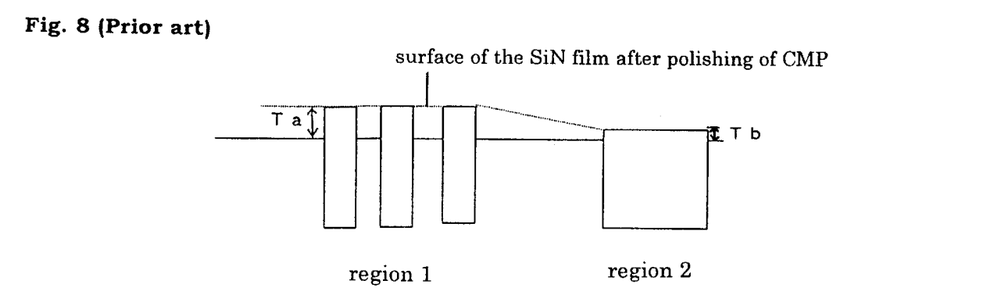
FIG. 8 is a schematic cross sectional view of a semiconductor device explaining the problem of the method of the prior art.
Figure 9:
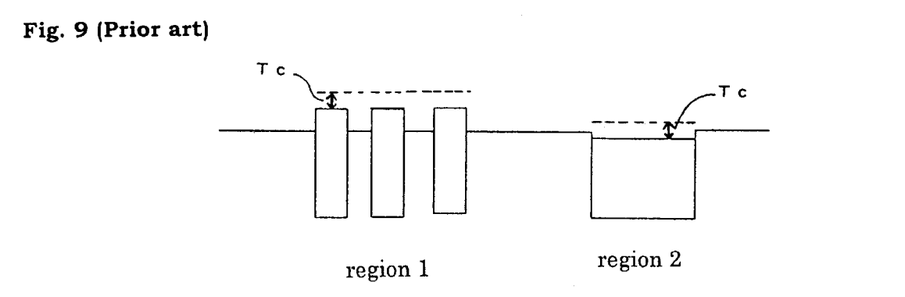
FIG. 9 is a schematic cross sectional view of a semiconductor device explaining the problem of the method of the prior art.

FIGS. 8 and 9 show a schematic cross sectional view of an element having a difference in thickness of a filled oxide film developed by polishing the whole wafer. The height from the surface of the silicone substrate to the surface of the filled oxide film (the surface of the element isolation region) in the region 1 is denoted by Ta, and the height from the surface of the silicone substrate to the surface of the element isolation region in the region 2 is denoted by Tb (Ta>Tb). The filled oxide film is further removed by the step of removing the nitride film and the oxide film that is carried out after polishing the whole wafer. The amount of removal of the filled oxide film at this time is denoted by Tc (FIG. 9).

Figure 10:
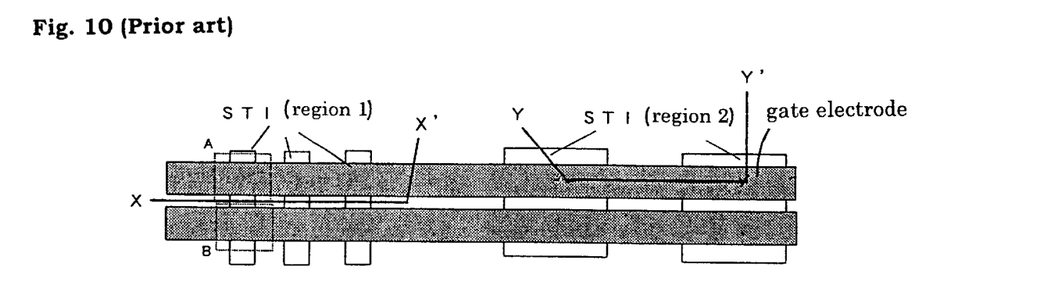
FIG. 10 is a schematic cross sectional view of a semiconductor device explaining the problem of the method of the prior art.
Figure 11:
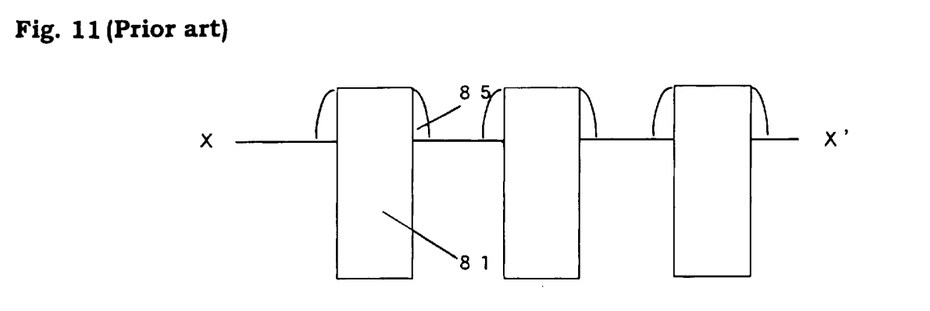
FIG. 11 is a cross sectional view on line X–X' in FIG. 10.

In the case of Ta>Tc>Tb, the surface of the element isolation region is higher than the surface of the silicon substrate in the region 1 and is lower than the surface of the silicon substrate in the region 2. Thereafter, a gate oxide film and a gate electrode are formed (FIG. 10). FIG. 11 is a cross sectional view on line X–X' in FIG. 10 in the region 1. When the step between the surface of the element isolating region and the surface of the silicon substrate is large, a side wall 85 is formed with a material of the gate electrode on the side surface of the element isolating region to cause a problem of formation of a short circuit of electrodes between the elements A and B.

Figure 12:
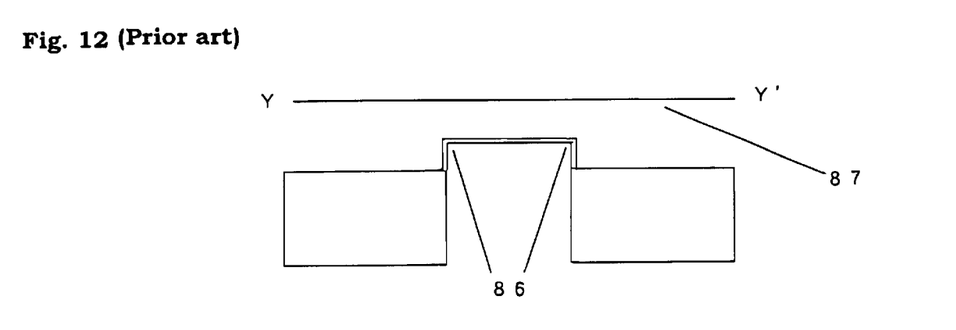
FIG. 12 is a cross sectional view on line Y–Y' in FIG. 10.

FIG. 12 is a cross sectional view on line Y–Y' in FIG. 10 in the region 2. Because the surface of the element isolating region is lower than the surface of the silicon substrate, concentration of an electric field from the gate electrode 87 occurs at channel edges 86 to lower the threshold value at the channel edges, and thus such a problem arises that good transistor characteristics cannot be obtained.

In the case of Ta<Tc and Tb<Tc, all the surface of all the element isolating regions is lower than the surface of the silicon substrate. The similar problem as in the forgoing case is also developed in this case that concentration of an electric field occurs at the channel edges to fail to obtain good transistor characteristics. Furthermore, in the case of Ta>Tc and Tb>Tc, the over etching amount on processing the gate electrode is generally required to be the amount of Ta–Tc. In this case, a sufficient selective ratio cannot be obtained when the thickness of the gate oxide film is decreased along with the progress of fine structures of elements, and therefore, the filled oxide film cannot be appropriately removed to make the electrode material remaining as a side wall, so as to bring about a problem of formation of a short circuit between the elements.

Accordingly, it is demanded that both Ta and Tb are slightly larger than Tc, and it is also demanded that the heights of the element isolating regions on silicon are uniform.

As described in the foregoing, there has been a problem in that when a difference is developed in the height of the filled oxide film, such problems occur that good transistor characteristics cannot be obtained, and the production process of the semiconductor device becomes complex. Under the circumstances, the inventors have found a process for producing a semiconductor device in that a uniform polishing rate can be obtained irrespective to an element region width to enable planation of an element, and thus the invention has been completed.

SUMMARY OF THE INVENTION

The present invention provides a process for producing a semiconductor device comprising plural element forming regions having different element region widths W and element isolating regions between said element forming regions, said process comprising a step of forming trenches on a semiconductor substrate having previously accumulated thereon a first dielectric film for forming said element isolating regions;

a step of accumulating a second dielectric film having a thickness t on said semiconductor substrate to fill in said trenches;

a step of removing part of said second dielectric film on said element forming regions that have an element regions width W satisfying the following equation:

$$W \geq 2t/\tan \theta$$

wherein $\theta$ represents an accumulation angle of said second dielectric film on said element forming region; and a step of polishing said second dielectric film by a CMP process.

The present invention provides a process for producing a semiconductor device comprising plural element forming regions having different element region widths W and element isolating regions between said element forming regions, said process comprising a step of forming a first dielectric film on a semiconductor substrate, and forming a first mask pattern on said element forming regions;

a step of removing said first dielectric film on said element isolating regions according to said first mask pattern, and forming trenches on said semiconductor substrate, by anisotropic etching;

a step of removing said first mask pattern, and accumulating a second dielectric film having a thickness t on said semiconductor substrate to fill in said trenches;

a step of forming a second mask pattern having openings on part of said second dielectric film on said element forming regions that have an element regions width W satisfying the following equation:

$$W \geq 2t/\tan \theta$$

wherein $\theta$ represents an accumulation angle of said second dielectric film on said element forming region;

a step of removing said second dielectric film according to said second mask pattern by anisotropic etching; and a step of removing said second mask pattern, and polishing said second dielectric film by a CMP process.

BRIEF DESCRIPTION OF THE DRAWINGS

FIG. 1(a)–FIG. 1(g) are schematic cross sectional views showing production steps of a semiconductor device of the present invention;

FIGS. 5 (a)–(e) are schematic cross sectional views showing a production steps of a semiconductor device of the prior art;

FIGS. 6 (a)–(e) are schematic cross sectional views showing a production steps of a semiconductor device of the prior art;

FIGS. 7 (a)–(c) are schematic cross sectional views showing a production steps of a semiconductor device of the prior art;

DESCRIPTION OF THE PREFERRED EMBODIMENTS

On a semiconductor substrate that can be used in the process of the invention, a first dielectric film has been previously accumulated.

Examples of the semiconductor substrate include various kinds of substrates including an element semiconductor substrate, such as silicon and germanium, a substrate formed with a compound semiconductor, such as GaAs and InGaAs, an SOI substrate and a multilayer SOI substrate. Among these, a silicon substrate is preferred.

The first dielectric film is not particularly limited as long as it is generally employed in semiconductor devices. Examples thereof include a single layer film and a multilayer film including an oxide film, such as a silicon oxide film (a thermal oxidation film, a low temperature oxidation film: LTO film, etc. and a high temperature oxidation film: HTO film), a nitride film, such as a silicon nitride film, an SOG film, a PSG film, a BSG film, a BPSG film, a PZT film, a PLZT film, a ferroelectric material film and an antiferroelectric material film. In the invention, films having a two-layer structure formed by accumulating an oxide film and a nitride film in this order are preferred.

The thickness of the first dielectric film can be appropriately adjusted depending on the function thereof, and for example, it is about from 100 to 400 nm. In the case where the first dielectric film has the two-layer structure formed by accumulating an oxide film and a nitride film, it is preferred that the oxide film has a thickness of about from 5 to 20 nm, and the nitride film has a thickness of about from 100 to 300 nm.

The process for forming the first dielectric film is appropriately selected depending on the material thereof, and examples thereof include various processes, such as a thermal oxidation process, a CVD process, a sputtering process and a vapor deposition process.

In the process of the invention, trenches are formed on the semiconductor substrate to form the element isolating regions.

The trenches may be formed by a known process, for example, a photolithography process and an etching process. Specifically, for example, a resist is coated on a semiconductor substrate provided with a first dielectric film, and a first mask pattern is formed to have openings on the element isolating regions. Subsequently, the first dielectric film and the semiconductor substrate on the element isolating regions are removed according to the first mask pattern by etching, so as to form trenches on the semiconductor substrate.

Etching may be carried out by either a dry etching process, such as a sputtering process, a reactive ion etching process and a plasma etching process, or a wet etching process using an acid or an alkali. The step of forming the trenches on the semiconductor substrate may be carried out in such a manner that the first dielectric film is patterned by using the resist as a mask, and after removing the resist, the trenches are formed by using the first dielectric film as a mask. In this case, however, such problems may be developed unless a sufficient selective ratio is present between the semiconductor substrate and the first dielectric film that the first dielectric film is thinned, and the thickness of the first dielectric film becomes non-uniform. Therefore, it is preferred that the etching of the semiconductor substrate is carried out by further arranging a mask material, such as $SiO_2$, on the resist or the first dielectric film.

While the depth and the width of the trenches formed on the semiconductor substrate are not particularly limited, the depth is preferably about from 100 to 1,000 nm, and the width is preferable about 100 nm or more.

After removing the resist, it is preferred that the interior of the trenches is subjected to thermal oxidation at a temperature of about from 900 to 1,150° C. to form a thermal oxidation film having a thickness of about from 10 to 100 nm.

In the process of the invention, a second dielectric film having a thickness t is then accumulated on the semiconductor substrate to fill the trenches.

The second dielectric film may be formed with the similar materials and may be accumulated in the similar manner as the first dielectric film, and an HDP-CVD oxide film is preferably used.

The second dielectric film preferably has a thickness t of about from 500 to 700 nm.

In the process of the invention, part of the second dielectric film on the element forming regions that have an element regions width W satisfying the equation $W \geq 2t/\tan \theta$ (wherein $\theta$ represents a accumulation angle of the second dielectric film on the element forming region) is removed.

The removal of the second dielectric film may be carried out in the similar manner as the removal of the first dielectric film. For example, a resist is coated on the semiconductor substrate, and a second mask pattern is formed to have openings of desired position and size by a known photolithography. Subsequently, the part of the second dielectric film on the element forming regions is removed according to the second mask pattern.

The second mask pattern may also be formed to have openings in at least two sites on the second dielectric film per one of the element forming regions. It is preferred that the openings are formed to make a total area of a cross section of the second dielectric film that is removed equal to a total area of a cross section of the second dielectric film that is not removed. It is also preferred that the openings are formed to make an area of a cross section of the second dielectric film that is removed equal to an area of a cross section of the second dielectric film that is not removed per one of the element forming regions.

The removal of the part of the second dielectric film is carried out by etching according to the second mask pattern. Therefore, at least two sites of the second dielectric film may be removed per one of the element forming regions. It is preferred that the removal is carried out in such a manner that a total volume of the second dielectric film that is removed is equal to a total volume of the second dielectric film that is not removed. It is also preferred that the removal is carried out in such a manner that a volume of the second dielectric film that is removed is equal to a volume of the second dielectric film that is not removed per one of the element forming regions.

The formation of the second mask pattern and the removal of the second dielectric film will be described in more specific manner below.

Figure 1A:
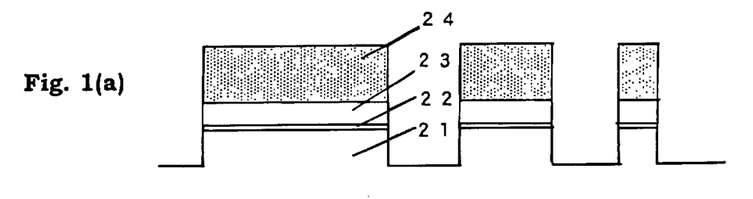
Figure 1B:
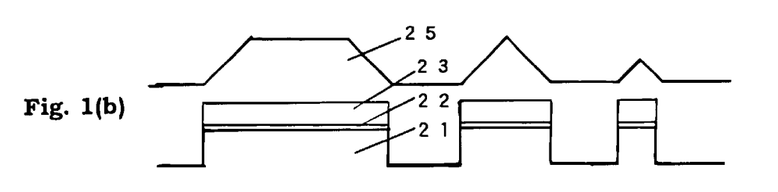
Figure 1C:
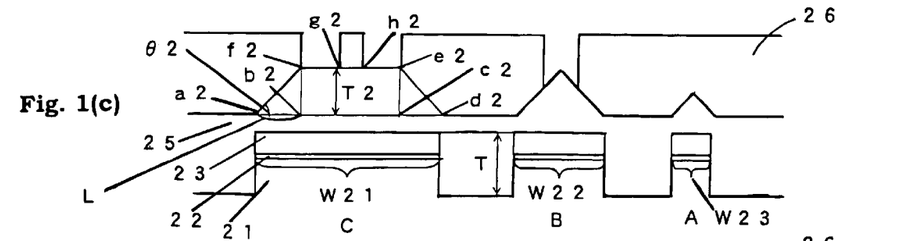

For example, in the case where the element region width $W23$ of the element forming region A satisfies $W < 2t/\tan \theta$, the element region width $W22$ of the element forming region B satisfies $W = 2t/\tan \theta$, and the element region width $W21$ of the element forming region C satisfies $W \geq 2t/\tan \theta$, as shown in FIG. 1(c), in the element forming region A, no opening is formed in the second mask pattern; in the element forming region B, the openings are formed to make the area of the cross section of the second dielectric film that is removed equal to the area that is not removed; and in the element forming region C, the openings are formed to make the total area of the cross section of the second dielectric film in the element forming region A, the element forming region B and the element forming region C that is removed equal to the total area that is not removed. In the element forming region C, two openings may be formed as shown in FIG. 1(c), and four openings may be formed as shown in FIG. 2.

Figure 2:
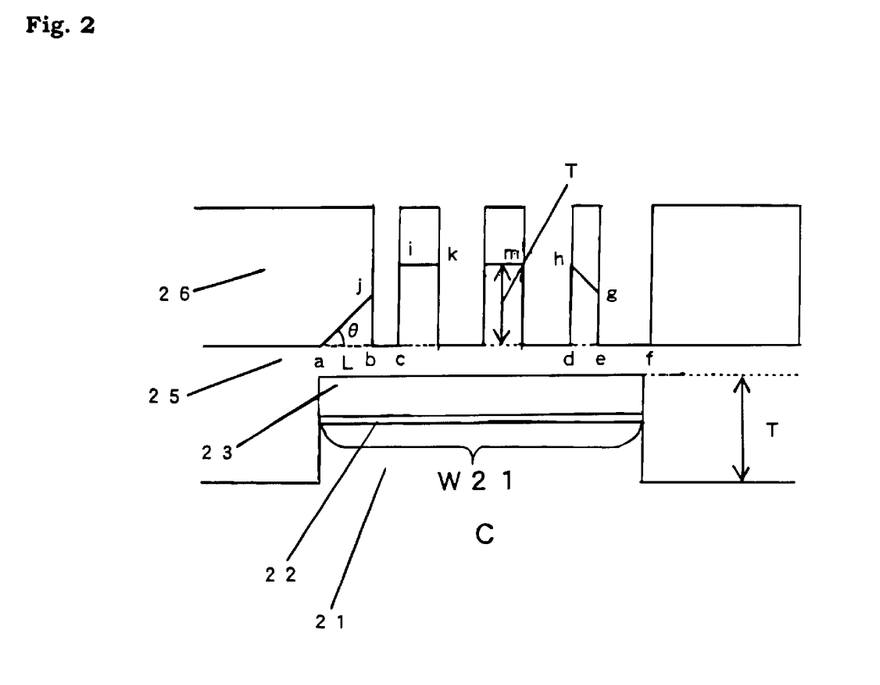
FIG. 2 is a schematic cross sectional view showing production steps of a semiconductor device of the present invention.

In the case where the openings are formed to make the area of the cross section of the second dielectric film per one of the element forming regions that is removed equal to the area that is not removed, when four openings are formed as shown in FIG. 2, the configuration may be set up in such a manner that the area of the triangle abj and the area of the triangle efg are the same as the area of the trapezoid bcij and the area of the trapezoid degh, respectively, and non-openings and openings are arranged at constant intervals on the line ih.

The amount of removal (removing thickness) of the second dielectric film is preferably the same as the width of the bottom base of the openings on the second dielectric film.

The shape of the removed part is not particularly limited, and for example, may be either, a line form, a cylindrical form, a rectangular parallelepiped form or a cubic form.

After removing the second dielectric film, the second mask pattern is removed.

In the process of the invention, the second dielectric film is then polished by the CMP process. The polishing is carried out until the first dielectric film formed under the second dielectric film is exposed.

An abrasive used in the CMP process is not particularly limited, and examples thereof include a slurry obtained by mixing, for example, silica and alumina, with water containing a pH adjusting agent.

The first dielectric film is then removed. In the case where the first dielectric film is formed by accumulating an oxide film and a nitride film in this order, the nitride film can be removed, for example, by hot phosphoric acid, and the oxide film can be removed, for example, by an HF solution. In this case, it is preferred that after completely removing the nitride film, about from 10 to 20 nm in thickness of the oxide film is removed.

After removing the first dielectric film, ions required for adjusting the threshold value of the transistor and for forming a well are implanted into the substrate, for example, by a know implantation process, so as to form channel forming regions of the transistor. For example, a gate oxide film and a thermal oxidation film are then accumulated on the wafer, and an LP-CVD film as a polysilicon film is accumulated. The gate electrode is then processed and added with an impurity to form a source/drain region. Subsequently, an interlevel dielectric film is accumulated, and contacts and interconnections are formed, whereby an nMOS transistor is produced.

The process of the invention is not limited to the production process of an nMOS transistor but can be applied to production of any semiconductor device including a pMOS transistor and a CMOS transistor.

EXAMPLE

The step of forming an isolating regions of a semiconductor device (nMOS transistor) according to the invention will be described below with reference to the example, but the invention is not construed as being limited thereto.

As shown in FIG. 1(a), an oxide film 22 is accumulated on the surface of a semiconductor silicon substrate 21 in an HCl atmosphere at 900° C. to a thickness of 10 nm. An SiN film 23 is then accumulated on the oxide film 22 by an LP-CVD process to a thickness of 190 nm. A resist 24 is then coated on the SiN film 23, and openings are formed by a known photolithography process on the element isolating regions to form a first mask pattern. Anisotropic dry etching is then carried out, whereby the oxide film 22 and the SiN film 23 are removed according to the first mask pattern, and further the silicon substrate is etched to form trenches having a depth of 300 nm (FIG. 1(a)).

After removing the resist 24, thermal oxidation is carried out at a temperature of from 900 to 1,150° C. to form a thermal oxidation film having a thickness of 30 nm, whereby the interior of the trenches on the silicon substrate 21 is oxidized. An HDP-CVD oxide film 25 is then accumulated to a thickness of 670 nm on the whole surface of the wafer.

After coating a resist 26, openings are formed on part of the element forming regions that have an element regions width W satisfying the equation $W \geq 2t/\tan\theta$ by a known photolithography process, so as to form a second mask pattern. At this time, the openings are formed in three sites on the HDP-CVD oxide film 25 on the element forming regions. The openings are formed also to make the area of the cross section of the HDP-CVD oxide film 25 that is removed equal to the area of the cross section that is not removed per one of the element forming regions (FIG. 1(d)).

In this example, the angle $\theta$ is set at 45°, the element region width W23 of the element forming region A is 500 nm ($W < 2t/\tan\theta$), the element region width W22 of the element forming region B is 1,400 nm ($W = 2t/\tan\theta$), and the element region width W21 of the element forming region C is 5,000 nm ($W \geq 2t/\tan\theta$). Therefore, the opening does not be formed in the element forming region A. The opening is formed to the opening width of 292 nm (an area of a cross section of HDP-CVD oxide film 25 that is removed equal to an area of a cross section of said oxide film 25 that is not removed in the element forming region B). The openings in the element forming region C are formed to remove a half of the total volume of a cross section of the HDP-CVD oxide film of the element forming regions A and C (the area of a cross section of the HDP-CVD oxide film: (4600+3600)× 500/2+2500). As a result, the opening width of the HDP-CVD oxide film on the element forming region C is set to be equal to ((4600+3600)×500/2+2500)/2/500(height)≈2053 nm.

In the above process, two openings are formed to make a total area of cross section of the HDP-CVD oxide film on the element forming region A, B and C that is removed equal to total area of cross section of the HDP-CVD oxide film on the element forming region A, B and C that is not removed. Since two openings are formed on the element forming region C, each of the opening width is sets to be equal to 1027 nm.

Figure 1D:
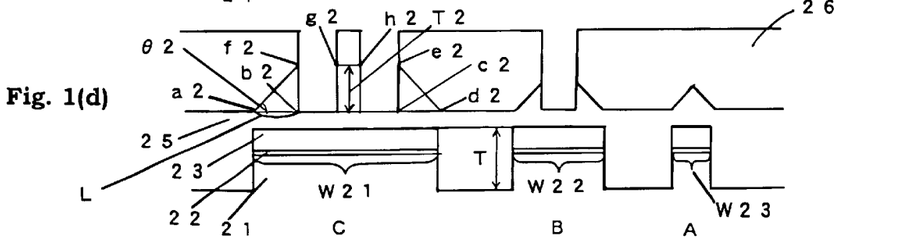

As shown in FIG. 1(d), the HDP-CVD oxide film 25 is removed according to the second mask pattern by anisotropic dry etching. The amount of removal (removing thickness) of the HDP-CVD oxide film 25 is set to be equal to the opening width of the HDP-CVD oxide film 25. In this example, therefore, the HDP-CVD oxide film 25 having a thickness of 500 nm is removed to make the oxide film having a thickness of 200 nm remaining on the SiN film 23 in the element forming region C.

Figure 1E:
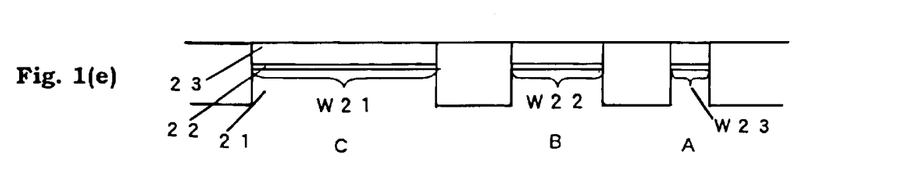

The HDP-CVD oxide film 25 is then removed by the CMP process until the SiN film 23 is exposed (FIG. 1(e)).

Figure 1F:
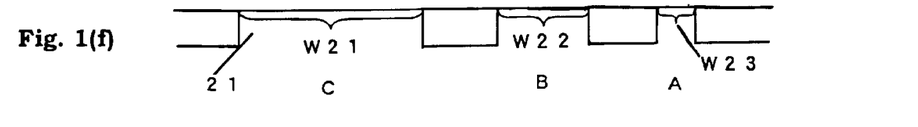
Figure 1G:
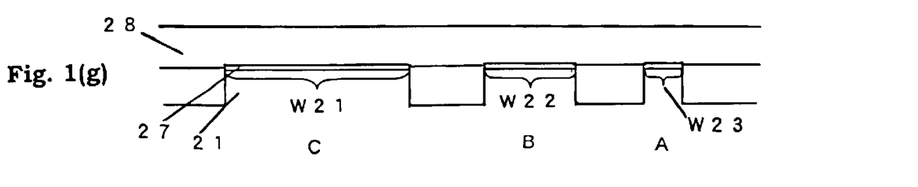

The SiN film 23 is then removed by hot phosphoric acid, and ions required for adjusting the threshold value of the transistor and for forming a well are implanted into the substrate by a know implantation process, so as to form channel forming regions of the transistor. About 15 nm in thickness of the oxide film 22 is then removed by an HF solution (FIG. 1(f)), and a gate oxide film 27 is formed, followed by accumulating a thermal oxidation film (not shown in the figure) having a thickness of 5 nm and an LP-CVD film (thickness: 25 nm) as a polysilicon film 28.

The gate electrode is then processed and added with an impurity to form a source/drain region by a known process. Subsequently, an interlevel dielectric film is accumulated, and contacts and interconnections are formed, whereby an nMOS transistor is produced.

Effect of the Invention

According to the invention, the polishing rate on the CMP process in an element isolating step is stabilized irrespective to the element region width, and thus an element having a higher planation degree than the conventional product can be produced. As a result, the height of the element isolating regions from the surface of the silicon substrate can be easily controlled, whereby the transistor characteristics are stabilized, and further the cost for electrode processing can be suppressed.

What is claimed is:

1. A process for producing a semiconductor device comprising plural element forming regions having different element region widths W and element isolating regions between said element forming regions, said process comprising:

forming trenches on a semiconductor substrate having thereon a first dielectric film for forming said element isolating regions;

accumulating a second dielectric film having a thickness t on said semiconductor substrate to fill in said trenches;

determining whether to remove part of said second dielectric film on said element forming regions based at least in part on whether the element forming regions have an element region width W satisfying the following equation:

$$W \geq 2t/\tan \theta$$

wherein θ represents an accumulation angle of said second dielectric film on said element forming region, and thereby (a) removing only part of said second dielectric film on each element forming region satisfying said equation so as to leave a significant part of the dielectric film on said element forming regions satisfying said equation, and (b) not removing said second dielectric film on element forming regions not satisfying said equation;

wherein in said removing a total volume of said second dielectric film that is removed is equal to a total volume of said second dielectric film that is not removed; and polishing said second dielectric film by a CMP process.

2. A process for producing a semiconductor device as claimed in claim 1, wherein in said removing step, at least two sites of said second dielectric film are removed per one of said element forming regions.

3. A process for producing a semiconductor device as claimed in claim 1, wherein in said removing, a volume of said second dielectric film on a first element forming region that is removed is equal to a volume of said second dielectric film that is not removed from said first element forming region.

4. A process for producing a semiconductor device as claimed in claim 1, wherein said second dielectric film is an HDP-CVD oxide film.

5. A process for producing a semiconductor device comprising plural element forming regions having different element region widths W and element isolating regions between said element forming regions, said process comprising:

forming a first dielectric film on a semiconductor substrate, and forming a first mask pattern on said element forming regions;

removing said first dielectric film on said element isolating regions according to said first mask pattern, and forming trenches on said semiconductor substrate, by anisotropic etching;

removing said first mask pattern, and accumulating a second dielectric film having a thickness t on said semiconductor substrate to fill in said trenches;

forming a second mask pattern having openings on part of said second dielectric film on said element forming regions that have an element region width W satisfying the following equation:

$$W \geq 2t/\tan \theta$$

wherein θ represents a accumulation angle of said second dielectric film on said element forming region, thereby determining from which of the element forming regions to remove at least a part of the second dielectric film based upon whether the element forming regions satisfy said equation;

a step of removing said second dielectric film according to said second mask pattern by anisotropic etching;

wherein in said forming of the second mask pattern, the openings are formed so that a total area of cross section of the second dielectric film that is removed is equal to a total area of a cross section of the second dielectric film that is not removed; and a step of removing said second mask pattern, and polishing said second dielectric film by a CMP process.

6. A process for producing a semiconductor device as claimed in claim 5, wherein in said step of forming said second mask pattern, said openings are formed in at least two sites on said second dielectric film per one of said element forming regions.

7. A process for producing a semiconductor device as claimed in claim 5, wherein in said step of forming said second mask pattern, said openings are formed to make an area of a cross section of said second dielectric film that is removed equal to an area of a cross section of said second dielectric film that is not removed per one of said element forming regions.

8. A process for producing a semiconductor device as claimed in claim 5, wherein said first dielectric film has a two-layer structure comprising an oxide film and a nitride film accumulated in this order.

9. A process for producing a semiconductor device as claimed in claim 5, wherein said second dielectric film is an HDP-CVD oxide film.

10. A process for producing a semiconductor device comprising plural element forming regions having different element region widths W and element isolating regions between said element forming regions, said process comprising:

forming trenches on a semiconductor substrate having thereon a first dielectric film for forming said element isolating regions;

accumulating a second dielectric film having a thickness t on said semiconductor substrate to fill in said trenches;

determining whether to remove part of said second dielectric film on said element forming regions based at least in part on whether the element forming regions have an element regions width W satisfying the following equation:

$$W \geq 2t/\tan \theta$$

wherein θ represents an accumulation angle of said second dielectric film on said element forming region, and thereby (a) removing only part of said second dielectric film on each element forming region satisfying said equation so as to leave a significant part of the dielectric film on said element forming regions satisfying said equation, and (b) not removing said second dielectric film on element forming regions not satisfying said equation; and polishing said second dielectric film by a CMP process.

11. A process for producing a semiconductor device comprising plural element forming regions having different element region widths W and element isolating regions between said element forming regions, said process comprising:

forming trenches on a semiconductor substrate having thereon a first dielectric film for forming said element isolating regions;

accumulating a second dielectric film having a thickness t on said semiconductor substrate to fill in said trenches;

removing part of said second dielectric film on said element forming regions that have an element regions width W satisfying the following equation:

$$W \geq 2t/\tan\theta \qquad (5)$$

wherein θ represents an accumulation angle of said second dielectric film on said element forming region;

prior to the removing, forming a mask pattern so that openings thereof are formed to make an area of a cross section of said second dielectric film that is removed equal to an area of a cross section of said second dielectric film that is not removed per one of said element forming regions; and polishing said second dielectric film by a CMP process.

12. A process for producing a semiconductor device comprising plural element forming regions having different element region widths W and element isolating regions between said element forming regions, said process comprising:

forming a first dielectric film on a semiconductor substrate, and forming a first mask pattern on said element forming regions;

removing said first dielectric film on said element isolating regions according to said first mask pattern, and forming trenches on said semiconductor substrate, by anisotropic etching;

removing said first mask pattern, and accumulating a second dielectric film having a thickness t on said semiconductor substrate to fill in said trenches;

forming a second mask pattern having openings on part of said second dielectric film on said element forming regions that have an element regions width W satisfying the following equation:

$$W \geq 2t/\tan\theta$$

wherein θ represents a accumulation angle of said second dielectric film on said element forming region;

removing said second dielectric film according to said second mask pattern by anisotropic etching;

wherein in said forming of said second mask pattern, said openings therein are formed to make an area of a cross section of said second dielectric film that is removed equal to an area of a cross section of said second dielectric film that is not removed per one of said element forming regions; and removing said second mask pattern, and polishing said second dielectric film by a CMP process.

* * * * *